United States Patent
Yoshii

(10) Patent No.: US 10,237,968 B2
(45) Date of Patent: Mar. 19, 2019

(54) ELECTROOPTICAL APPARATUS AND ELECTRONIC DEVICE

(71) Applicant: SEIKO EPSON CORPORATION, Tokyo (JP)

(72) Inventor: Masahito Yoshii, Matsumoto (JP)

(73) Assignee: SEIKO EPSON CORPORATION, Tokyo (JP)

( * ) Notice: Subject to any disclaimer, the term of this patent is extended or adjusted under 35 U.S.C. 154(b) by 0 days.

(21) Appl. No.: 15/886,141

(22) Filed: Feb. 1, 2018

(65) Prior Publication Data

US 2018/0228018 A1 Aug. 9, 2018

(30) Foreign Application Priority Data

Feb. 6, 2017 (JP) .................................. 2017-019438

(51) Int. Cl.
| H05K 1/02 | (2006.01) |
| H05K 5/00 | (2006.01) |
| H02H 7/20 | (2006.01) |
| H04N 5/14 | (2006.01) |

(52) U.S. Cl.
CPC ............. *H05K 1/0216* (2013.01); *H02H 7/20* (2013.01); *H04N 5/14* (2013.01); *H05K 1/028* (2013.01); *H05K 5/0017* (2013.01)

(58) Field of Classification Search
CPC .... H05K 5/0017; H05K 5/0021; H05K 1/028; H05K 1/0216

See application file for complete search history.

(56) References Cited

U.S. PATENT DOCUMENTS

| 2004/0125258 A1* | 7/2004 | Moon ................... G02F 1/1345 349/43 |
| 2006/0022969 A1* | 2/2006 | Lee .................... G02F 1/136286 345/211 |
| 2009/0219263 A1* | 9/2009 | Shino ....................... G09G 3/20 345/204 |
| 2011/0122356 A1 | 5/2011 | Saimen |
| 2011/0134621 A1 | 6/2011 | Saimen |
| 2012/0236514 A1 | 9/2012 | Saimen |
| 2017/0103725 A1* | 4/2017 | Seki ...................... G09G 3/3677 |

FOREIGN PATENT DOCUMENTS

| JP | H02-069497 U | 5/1990 |
| JP | 2000-242194 A | 9/2000 |
| JP | 2011-112666 A | 6/2011 |
| JP | 2011-138101 A | 7/2011 |
| JP | 2012-194242 A | 10/2012 |
| JP | 2015-106109 A | 6/2015 |

\* cited by examiner

*Primary Examiner* — Hoa C Nguyen
(74) *Attorney, Agent, or Firm* — Oliff PLC

(57) ABSTRACT

An electrooptical apparatus includes an element substrate of which a first terminal group and a second terminal group for connecting each flexible substrate are sequentially formed thereon from a displaying portion. A signal wiring for supplying a video signal to a display control circuit for driving the displaying portion is dispersed and connected to the first terminal group and the second terminal group. In addition, a resistance of the signal wiring for the video signal which passes through the first terminal group and reaches the display control circuit and a resistance of the signal wiring for the video signal which passes through the second terminal group and reaches the display control circuit are substantially equal to each other.

4 Claims, 9 Drawing Sheets

ELECTROOPTICAL APPARATUS AND ELECTRONIC DEVICE

BACKGROUND

1. Technical Field

The present invention relates to an electrooptical apparatus in which a flexible substrate such as a tape carrier package (TCP), a flexible printed circuit (FPC), or a chip on film (COF) is disposed on a terminal group provided on a substrate, and an electronic device.

2. Related Art

Generally, an electrooptical apparatus provided with a liquid crystal panel (liquid crystal light valve) connects the liquid crystal panel and a flexible substrate to each other, and supplies the number of video signals corresponding to the number of data lines from the flexible substrate. In order to realize a high resolution of the electrooptical apparatus, the number of panel terminals needs to be increased. Meanwhile, there is a limitation for a pitch interval between the panel terminals. Therefore, it becomes more difficult to secure a terminal disposing region where the panel terminals and the flexible substrate are connected to each other as the high resolution increase.

In the related art, in order to secure the terminal disposing region, a configuration in which terminal groups configured with a plurality of terminals are disposed parallel to an electrooptical panel is adopted (refer to JP-A-2012-194242).

However, in the electrooptical apparatus described above, when the number of signal wirings for a video signal is increased as the high resolution increases, a connection destination of the signal wiring for the video signal is necessarily divided into a plurality of terminal groups. In this case, a transmission delay time of the video signal of the signal wiring which passes through a terminal group close to the opposite substrate and supplies the video signal to a display control circuit and a transmission delay time of the video signal of the signal wiring which passes through a terminal group distant away from the opposite substrate and supplies the video signal to a display control circuit are different from each other. Therefore, driving of the electrooptical apparatus at a high speed becomes difficult. In addition, a component in a high frequency band of the video signal which passes through the terminal group distant away from the opposite substrate and is input to the display control circuit tends to be more deteriorated than a component in a high frequency band of the video signal which passes through the terminal group close to the opposite substrate and is input to the display control circuit. Accordingly, since the video signals having different frequency characteristics are supplied to the display control circuit, there is a problem in that a display quality is deteriorated.

SUMMARY

An advantage of some aspects of the invention is to provide an electrooptical apparatus provided with a plurality of terminal groups which is capable of driving at a high speed. In addition, another advantage is to improve a display quality in the electrooptical apparatus provided with the plurality of terminal groups.

According to an aspect of the invention, there is provided an electrooptical apparatus including a substrate on which a displaying portion displaying an image and a display control circuit for driving the displaying portion are formed, in which a first terminal group for connecting a first flexible substrate and a second terminal group for connecting a second flexible substrate are sequentially formed on the substrate from the displaying portion, a signal wiring for supplying a video signal to the display control circuit is dispersed in and connected to the first terminal group and the second terminal group, and a resistance of the signal wiring for the video signal which passes through the first terminal group and reaches the display control circuit and a resistance of the signal wiring for the video signal which passes through the second terminal group and reaches the display control circuit are substantially equal to each other.

According to the electrooptical apparatus, a difference between a transmission delay time of the video signal which is transmitted from the first terminal group to the display control circuit and a transmission delay time of the video signal which is transmitted from the second terminal group to the display control circuit can be reduced. Accordingly, the electrooptical apparatus can be driven at a high speed.

In this aspect, it is preferable that a wiring extending in the second terminal group is added to the terminal for the video signal in the first terminal group, and thus a capacitance of the signal wiring for the video signal which passes through the first terminal group and reaches the display control circuit and a capacitance of the signal wiring for the video signal which passes through the second terminal group and reaches the display control circuit be substantially equal to each other.

According to the aspect, the difference between the transmission delay time of the video signal being transmitted from the first terminal group to the display control circuit and the transmission delay time of the video signal being transmitted from the second terminal group to the display control circuit can be further reduced.

In this aspect, it is preferable that the signal wiring for the video signal which passes through the second terminal group and reaches the display control circuit pass through between two terminals adjacent to each other in the first terminal group.

According to the aspect, since a wiring length of the signal wiring for the video signal which passes through the second terminal group can be shortened, the electrooptical apparatus can be driven at a high speed.

In this aspect, it is preferable that the two terminals and the signal wiring passing through between the two terminals be a wiring on a different layer from each other.

According to the aspect, since a capacitance between the two terminals adjacent to each other in the first terminal group and the signal wiring of the video signal from the second terminal group passing through between the two terminals can be reduced, cross coupling between the video signals can be reduced.

In this aspect, it is preferable that the signal wiring for the video signal reaching the display control circuit from the terminal of the second terminal group include a signal wiring reaching a protection circuit from the first terminal group, and a signal wiring which extends along a first direction from the protection circuit toward the display control circuit side, continues in a second direction curved to the first direction, and then passes through between two terminals adjacent to each other of the second terminal group extending in the first direction.

According to the aspect, the signal wiring transmitting the video signal from the second terminal group is capable of reasonably passing through between the adjacent two terminals of the first terminal group.

In addition, according to the aspect, electrostatic noise being input to the second terminal group passes through the protection circuit, and then passes through a curved part of the signal wiring connected to the protection circuit. In this case, since the electrostatic noise is sufficiently attenuated by the protection circuit, the electrostatic noise passing through the curved part is weak. Accordingly, it is possible to prevent the curved part of the signal wiring from being melted due to discharging or the like caused by the electrostatic noise.

BRIEF DESCRIPTION OF THE DRAWINGS

The invention will be described with reference to the accompanying drawings, wherein like numbers reference like elements.

DESCRIPTION OF EXEMPLARY EMBODIMENTS

Hereinafter, an embodiment of the invention will be described with reference to drawings.

A. Embodiment

Figure 1:
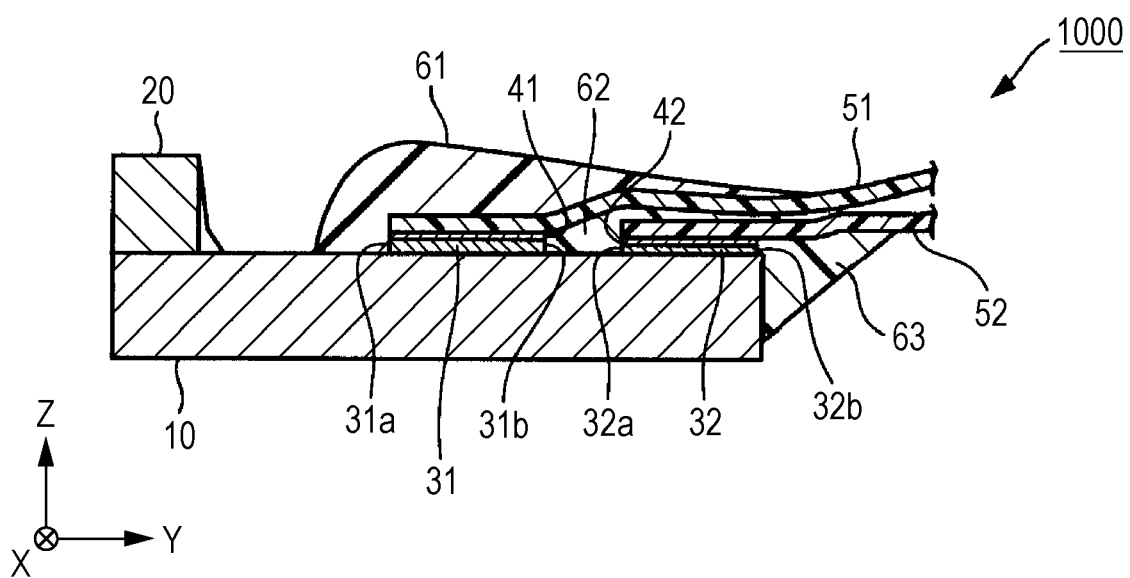
FIG. 1 is a left side view of an electrooptical apparatus which is an embodiment of the invention.
Figure 2:
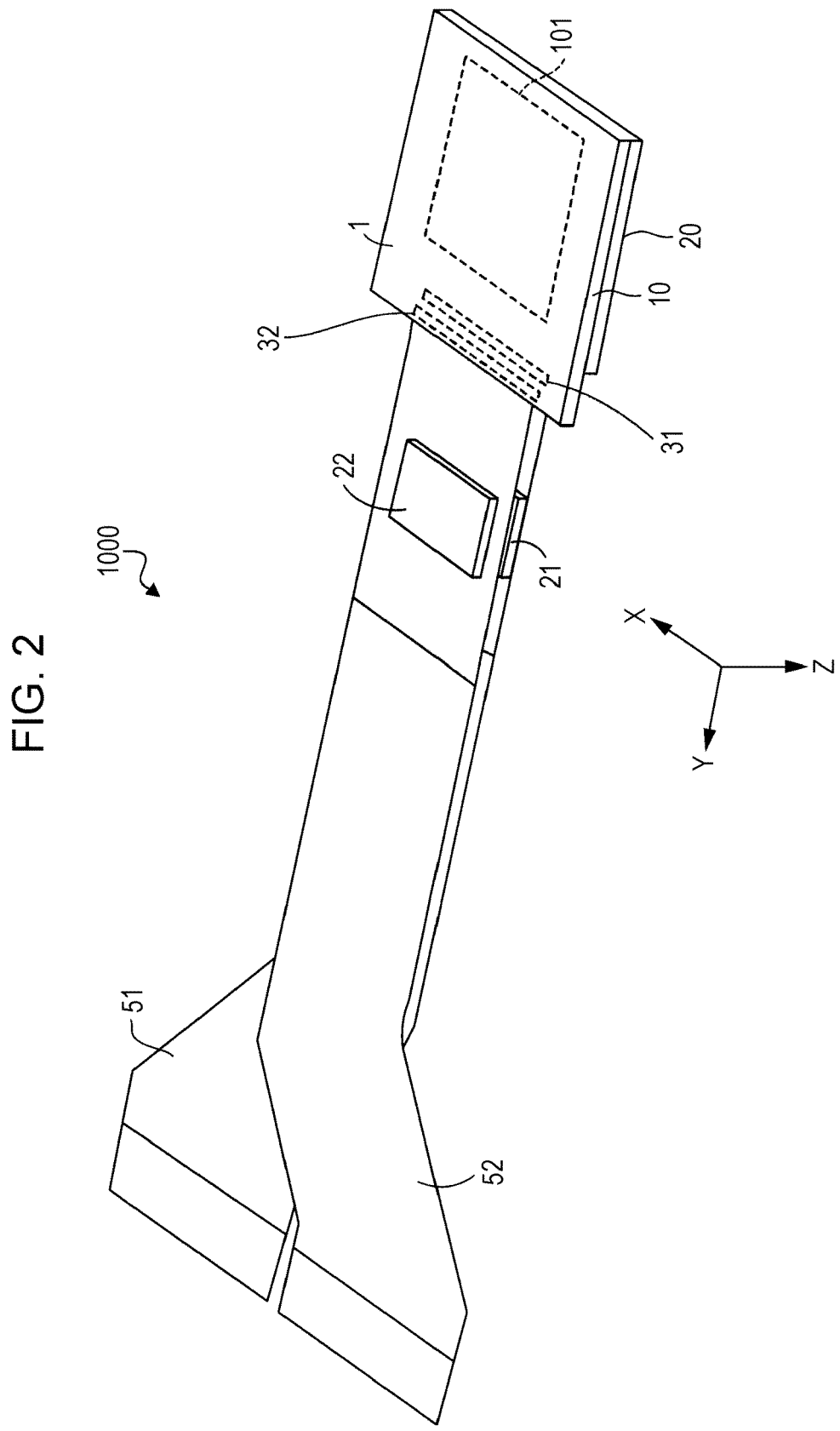
FIG. 2 is a perspective view of the electrooptical apparatus.

FIG. 1 is a left side view of an electrooptical apparatus 1000 which is an embodiment of the invention, and FIG. 2 is a perspective view of the electrooptical apparatus 1000. The electrooptical apparatus 1000 constitutes a liquid crystal displaying apparatus of an active matrix type which is a displaying unit of a small electronic device such as a projection type projector. The electrooptical apparatus 1000 is provided with an electrooptical panel 1, a first supplying circuit 21, a second supplying circuit 22, a first flexible circuit substrate (flexible printed circuit) 51, and a second flexible circuit substrate 52. Also, the electrooptical apparatus 1000 may have, for example, the number of pixels of 3840×2160 which is the number of pixels of a full Hi-vision being doubled in a vertical direction and doubled in a horizontal direction. In addition, each of the first supplying circuit 21 and the second supplying circuit 22 is, for example, an integrated circuit for driving. The electrooptical panel 1 includes an element substrate 10 on which an opposite substrate 20 is mounted. A pixel matrix 101 for displaying an image is formed on an overlapping part of the opposite substrate 20 on a surface of the element substrate 10.

In the element substrate 10, a first terminal group 31 and a second terminal group 32 are sequentially provided along the Y direction illustrated in FIG. 1 from the opposite substrate 20. Here, a first flexible substrate 51 is thermally compressed to the first terminal group 31 through an anisotropic conductive film 41, and the second flexible substrate 52 is thermally compressed to the second terminal group 32 through an anisotropic conductive film 42. The first flexible substrate 51 and the second flexible substrate 52 are, for example, a substrate of which polyimide is formed into a film shape. As illustrated in FIG. 1, the first flexible substrate 51 connected to the first terminal group 31 is disposed so as to overlap the second flexible substrate 52 connected to the second terminal group 32.

A resin member 63 covers a side surface 32b, which is distant away from the opposite substrate 20, of two side surfaces extending in an X direction of the second terminal group 32. Also, the resin member 63 is formed to cover a part continuing to the side surface 32b of each of the element substrate 10 and the second flexible substrate 52.

The resin member 62 covers a side surface 32a, which is close to the opposite substrate 20, of the two side surfaces extending in the X direction of the second terminal group 32, and a side surface 31b, which is distant away from the opposite substrate 20, of the two side surfaces extending in the X direction of the first terminal group 31. Also, the resin member 62 is formed to cover a part continuing to the side surface 32a of each of the element substrate 10 and the second flexible substrate 52, and a part continuing to the side surface 31b of each of the element substrate 10 and the first flexible substrate 51.

The resin member 61 covers the side surface 31a, which is a side surface close to the opposite substrate 20, of the two side surfaces 31a and 31b extending in the X direction of the first terminal group 31. Also, the resin member 61 covers a part continuing to the side surface 31a of each of the element substrate 10 and the first flexible substrate 51.

In the electrooptical apparatus 1000 as illustrated in FIG. 2, the first flexible circuit substrate 51 and the second flexible circuit substrate 52 are connected to one side of the electrooptical panel 1.

The first supplying circuit 21 is mounted on the first flexible circuit substrate 51 by a chip on film (COF) technology. The second supplying circuit 22 is implemented on the second flexible circuit substrate 52 by the COF technology. The first flexible circuit substrate 51 is stacked on the second flexible circuit substrate 52. The first supplying circuit 21 is stacked on the second supplying circuit 22. In such an embodiment, the first flexible circuit substrate 51 and the second flexible circuit substrate 52 are attached to each other so that parts thereof overlap with a displaying surface of the electrooptical panel 1 in a vertical direction (Z direction).

Various signals output by the first supplying circuit 21 are supplied to the first terminal group 31 being connected to the first flexible circuit substrate 51. In addition, various signals output by the second supplying circuit 22 are supplied to the second terminal group 32 being connected to the second flexible circuit substrate 52. The electrooptical panel 1 displays an image based on the various signals supplied to the first terminal group 31 and the various signals supplied to the second terminal group 32.

Wirings (omitted in FIGS. 1 and 2) for transmitting signals are provided to the first flexible circuit substrate 51 and the second flexible circuit substrate 52.

One end portion of the wiring of the first flexible circuit substrate 51 is connected to the first terminal group 31 of the electrooptical panel 1, and another end portion is connected to a control substrate (not illustrated) in which an upper control circuit is provided. The first supplying circuit 21 is electrically connected to the electrooptical panel 1 and the upper control circuit through the wiring of the first flexible circuit substrate 51.

One end portion of the wiring of the second flexible circuit substrate 52 is connected to the second terminal group 32 of the electrooptical panel 1, and another end portion is connected to the control substrate (not illustrated) in which the upper control circuit is provided. The second supplying circuit 22 is electrically connected to the electrooptical panel 1 and the upper control circuit through the wiring of the second flexible circuit substrate 52.

Figure 3:
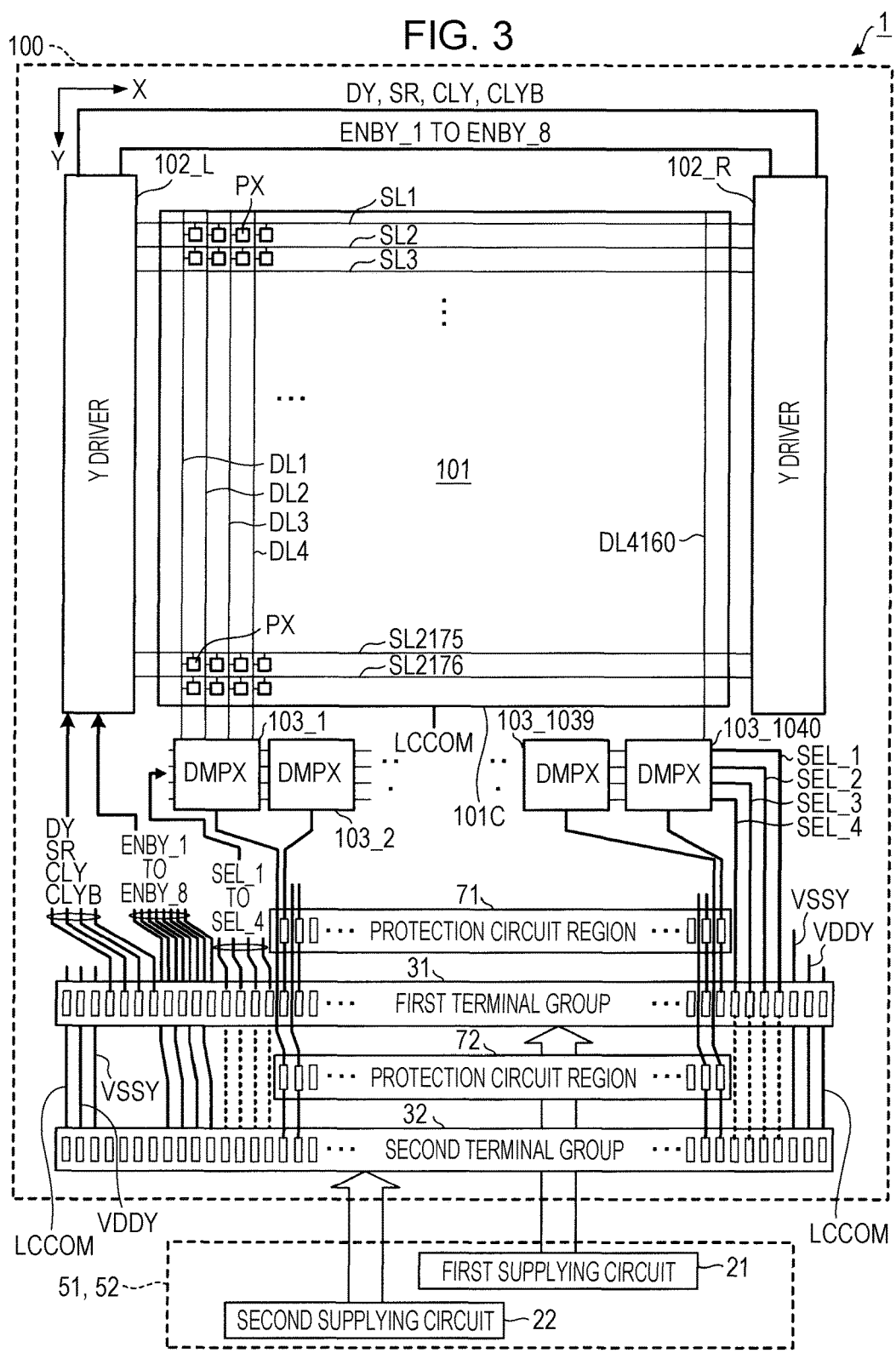
FIG. 3 is a circuit diagram illustrating an electrical configuration of a main portion of the electrooptical apparatus.

FIG. 3 is a circuit diagram illustrating an electrical configuration of a main portion of the electrooptical apparatus 1000. As illustrated in FIG. 3, the electrooptical apparatus 1000 includes the pixel matrix 101 and two Y drivers 102_L and 102_R, and 1040 demultiplexers (hereinafter, abbreviated as DMPX) 103_1 to 103_1040. The pixel matrix 101 functions as a displaying portion for displaying an image, and the Y drivers 102_L and 102_R and DMPXs 103_1 to 103_1040 function as a display control circuit for driving the pixel matrix 101.

The pixel matrix 101 includes 2176 scan lines SL1 to SL2176 extending in the X direction, 4160 data lines DL1 to DL4160 extending in the Y direction, and each pixel PX provided to correspond to each intersection of the scan lines and the data lines. Here, the pixel PX includes a pixel electrode (not illustrated) and a thin film transistor (TFT) element (not illustrated) in which one terminal of three terminals is connected to the pixel electrode. The other two terminals among the three terminals of the TFT element are connected to a scan line SLi (i is 1 to 2176) and a data line DLj (j is 1 to 4160).

In the opposite substrate 20, an opposite electrode 101C opposite to pixel electrodes of all pixels PX of the pixel matrix 101 is formed. An electro-optical material (not illustrated in FIGS. 1 and 2) such as a liquid crystal is pinched between the opposite electrode 101C and the pixel electrode of each pixel PX of the pixel matrix 101. The pixel matrix 101 is formed on a gap between the element substrate 10 and the opposite substrate 20.

The Y drivers 102_L and 102_R are disposed on both sides of the pixel matrix 101 in the X direction. The Y drivers 102_L and 102_R are synchronized with each other, and are scan line driving means for sequentially outputting a scanning pulse to the scan lines SL1 to SL2176 during one vertical scanning period, and instructs the scan line corresponding to the pixel PX which becomes a writing destination of the video signal.

To the Y drivers 102_L and 102R, a timing signal such as a start pulse DY for instructing an output start timing of the scanning pulse, two-phase clocks CLY and CLYB for instructing a shift timing of the start pulse DY, and a shift direction signal SR for instructing a shift direction of the start pulse DY, and enable signals ENBY_1 to ENBY_8 are applied.

Figure 4:
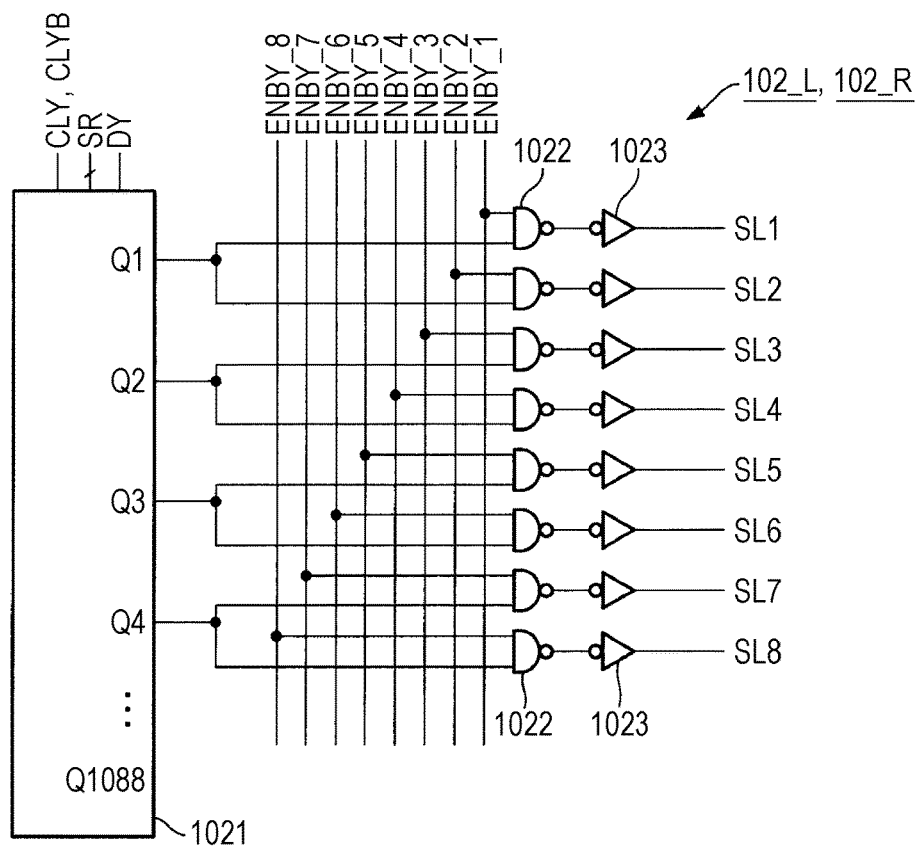
FIG. 4 is a circuit diagram illustrating a configuration of Y drivers of the electrooptical apparatus.

FIG. 4 is a circuit diagram illustrating a configuration of the Y drivers 102_L and 102R of the electrooptical apparatus. As illustrated in FIG. 4, the Y driver 102_L (102R) includes a shift register 1021, and 2176 sets of the NAND gates 1022 and the inverters 1023 respectively connected to the scan lines SL1 to SL2176.

The shift register 1021 is a sequential circuit of which a state is transited according to a timing signal constituted by the start pulse DY, the clocks CLY and CLYB, and the shift direction signal SR. More specifically, the shift register 1021 shifts in a first direction or in a second direction which is a reverse direction of the first direction by causing the start pulse DY to be synchronized with the clocks CLY and CLYB. Which direction to shift is determined by the shift direction signal SR. 2176 sets of the NAND gates 1022 and the inverters 1023 respectively connected to the scan lines SL1 to SL2176 output an enable signal as a scanning pulse being respectively applied based on a state of the shift register 1021 which is the sequential circuit, specifically, an output signal on an individual level of the shift register 1021. Also, in the embodiment, as the sequential circuit of which the state is transited according to the timing signal, the shift register 1021 is used, but the sequential circuit is not limited thereto. For example, a counter may be used instead of the shift register 1021.

Figure 5:
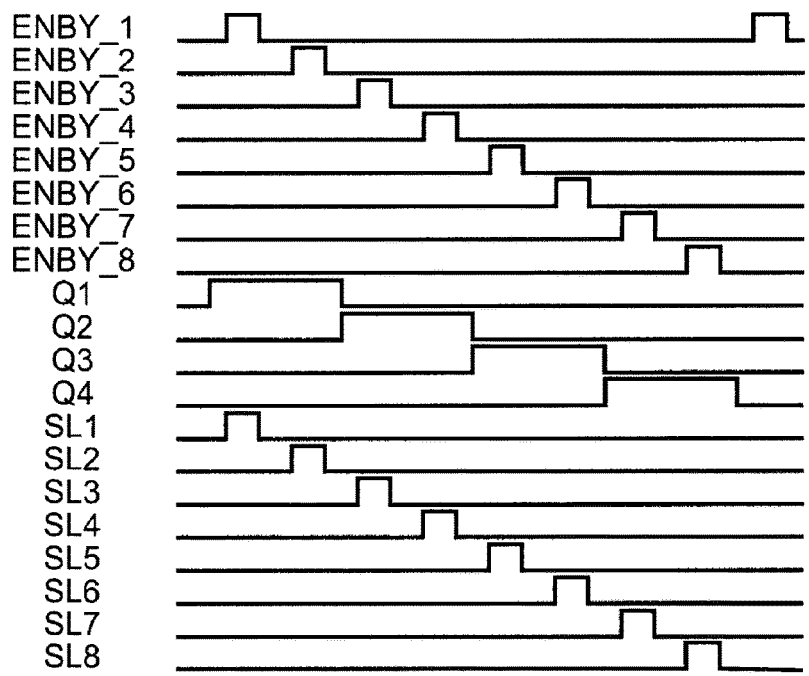
FIG. 5 is a time chart illustrating waveforms of each portion of the Y driver.

FIG. 5 is a time chart illustrating waveforms of each portion of the Y driver 102_L (102_R) illustrated in FIG. 4. The shift register 1021 repeats an operation for sequentially shifting the start pulse DY of a pulse width corresponding to one cycle of the clocks CLY and CLYB in every vertical scanning period. FIG. 5 illustrates an aspect in which a first level output signal Q1 to a fourth level output signal Q4 of the shift register 1021 reach sequential active levels.

The enable signals ENBY_1 to ENBY_8 are eight-phase pulses of which generation timings of the pulses are different from each other as a time corresponding to a half of one cycle of the clocks CLY and CLYB.

A set of NAND gate 1022 and inverter 1023 connected to the scan line SL1 outputs the enable signal ENBY_1, which is generated within a period at which the first level output signal Q1 of the shift register 1021 is at an active level, to the scan line SL1 as a scanning pulse.

A set of NAND gate 1022 and inverter 1023 connected to the scan line SL2 outputs the enable signal ENBY_2, which is generated within a period at which the first level output signal Q1 of the shift register 1021 is at an active level, to the scan line SL2 as the scanning pulse.

A set of NAND gate 1022 and inverter 1023 connected to the scan line SL3 outputs the enable signal ENBY_3, which is generated within a period at which the second level output signal Q2 of the shift register 1021 is at the active level, to the scan line SL3 as the scanning pulse.

A set of NAND gate 1022 and inverter 1023 connected to the scan line SL4 outputs the enable signal ENBY_4, which is generated within the period at which the second level output signal Q2 of the shift register 1021 is at the active level to the scan line SL4 as the scanning pulse.

As follows, within a period at which an i'-th level output signal Qi' of the shift register 1021 is at the active level, the scan lines SLi−1 and SLi (only i is 2i') are an output destination of the scanning pulse. At this time, an enable signal ENBY_k+1 (k is a remainder obtained by dividing i by 8) is output to the scan line SLi−1 as the scanning pulse, and the enable signal ENBY_k+2 is output to the scan line SLi as the scanning pulse.

The DMPX 103_*m* (m is 1 to 1040) constitutes video signal supplying means for outputting the video signal to the data line DLj (j is 1 to 4160). Select signals SEL_1 to SEL_4 are applied to the DMPX 103_*m* (m is 1 to 1040). The select signals SEL_1 to SEL_4 are supplied in synchronization with the clocks CLY and CLYB being supplied to the Y drivers 102_L and 102_R. The DMPX 103_$m$ (m is 1 to 1040) allocates video signal VIDm (m is 1 to 1040) to the data line DLj (j is 1 to 4160) based on the select signals SEL_1 to SEL_4.

More specifically, for example, the DMPX 103_1040 sets the output destination of the video signal VID1040 to the data line DL4157 in a case in which the select signal SEL_1 is at the active level. In addition, the DMPX 103_1040 sets the output destination of the video signal VID1040 to the data line DL4158 in a case in which the select signal SEL_2 is at the active level. In addition, the DMPX 103_1040 sets the output destination of the video signal VID1040 to the data line DL4159 in a case in which the select signal SEL_3 is at the active level. In addition, the DMPX 103_1040 sets the output destination of the video signal VID1040 to the data line DL4160 in a case in which the select signal SEL_4 is at the active level. Such the DMPX 103_1040 switches the output destination of the video signal VID1040 based on the select signals SEL_1 to SEL_4. The other DMPXs 103_$m$ (m is 1 to 1039) are the same as above.

Hitherto, the configuration of main portions of the electrooptical apparatus 1000 is schematically described.

Figure 6:
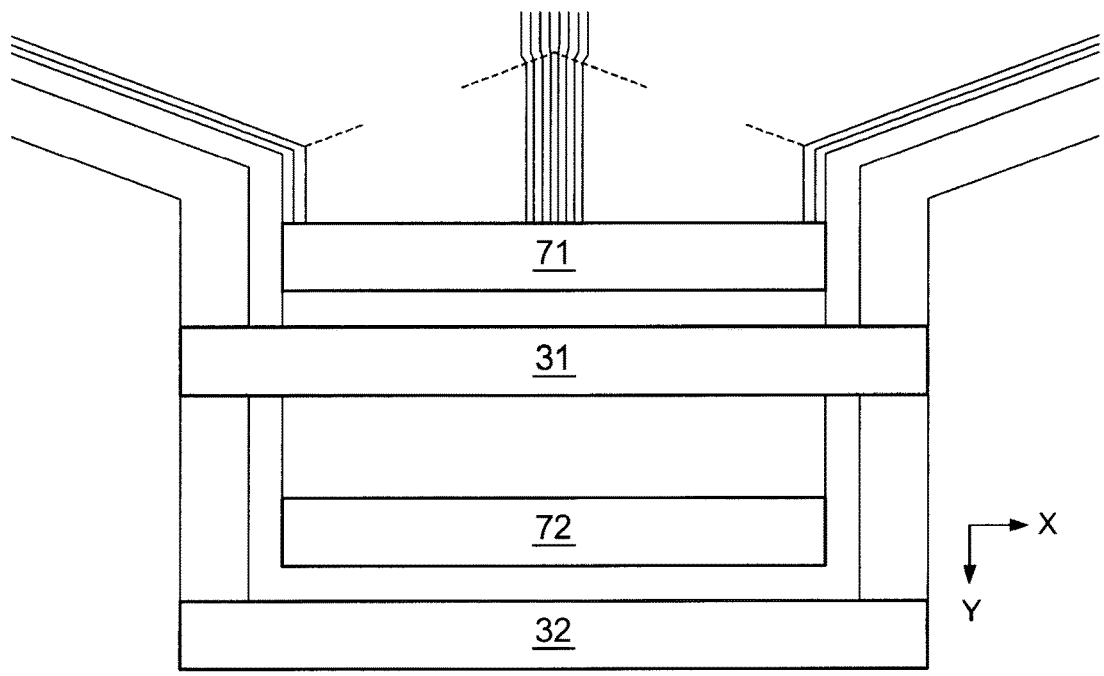
FIG. 6 is a plan view illustrating a wiring layout near a first terminal group and a second terminal group of an element substrate.

FIG. 6 is a plan view illustrating a wiring layout near the first terminal group 31 and the second terminal group 32 of the element substrate 10. In addition, FIG. 7 is a plan view illustrating a layout of the terminals in the first terminal group 31 and the second terminal group 32.

As illustrated in FIGS. 3 and 6, a protection circuit region 72 for the second terminal group 32 is provided between the first terminal group 31 and the second terminal group 32 in the element substrate 10. In the element substrate 10, a terminal for an input signal in the second terminal group 32, a signal wiring for connecting an input node of the protection circuit inside the protection circuit region 72, and a signal wiring for connecting an output node of the protection circuit and the input node inside the display control circuit to each other are formed (not illustrated in FIG. 6).

In the element substrate 10, the protection circuit region 71 for the first terminal group 31 is provided between an opposite region to the opposite substrate 20 (that is, region of displaying portion) and the first terminal group 31. In the element substrate 10, a signal wiring for connecting the terminal for the input signal in the first terminal group 31 and the input node of the protection circuit inside the protection circuit region 71 to each other, and a signal wiring for connecting the output node of the protection circuit and the input node inside the display control circuit to each other are formed.

Figure 7:
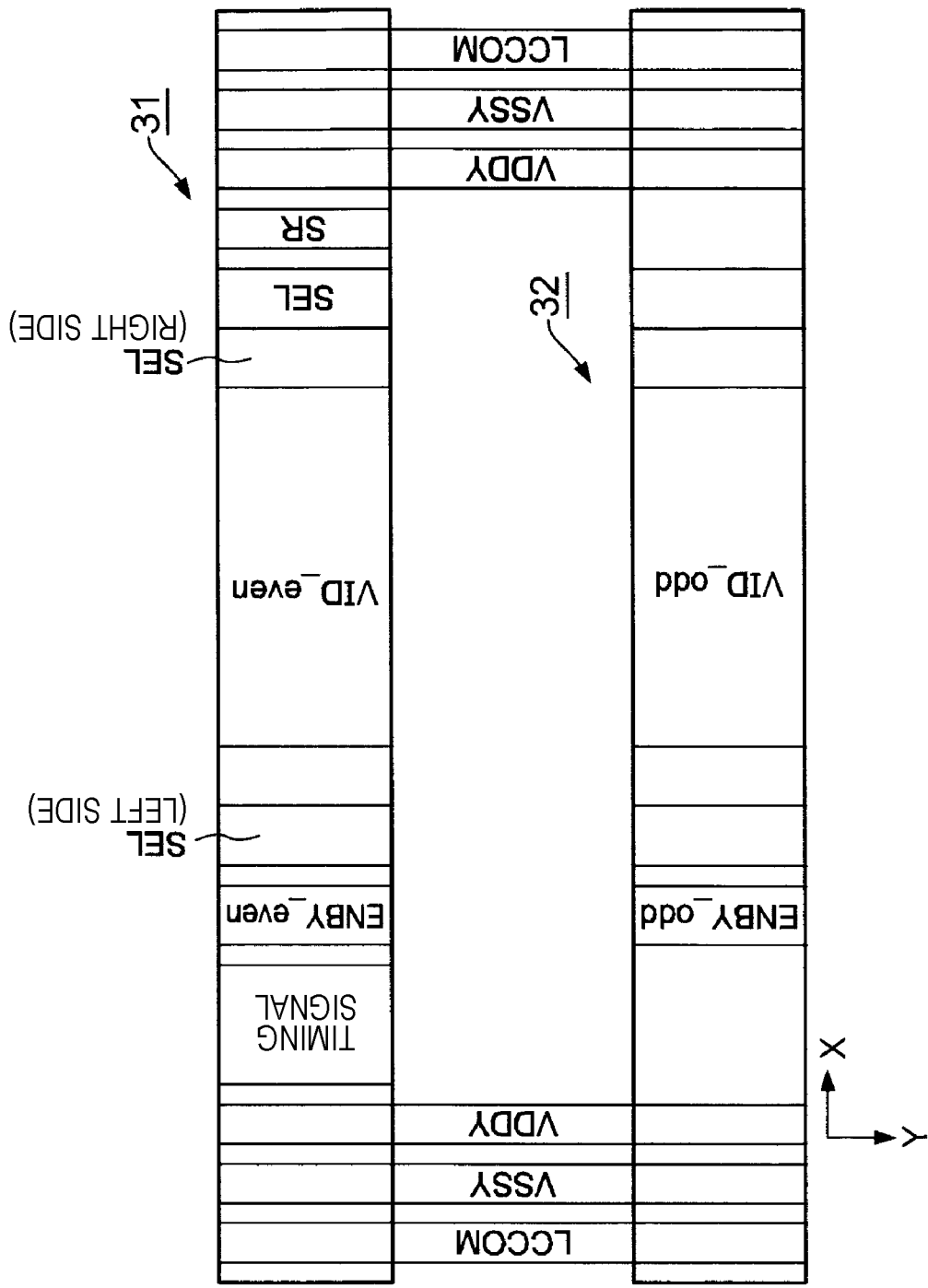
FIG. 7 is a plan view illustrating a layout of the terminals in the first terminal group and the second terminal group.

As illustrated in FIG. 7, in the first terminal group 31 and the second terminal group 32, there are a power source supplying terminal for supplying an opposite electrode voltage LCCOM to the opposite electrode 101C of the displaying portion, a power source supplying terminal for supplying a high potential power source voltage VDDY to the Y drivers 102_L and 102_R, and a power source supplying terminal for supplying a low potential power source voltage VSSY to the Y drivers 102_L and 102_R.

In the embodiment, in order to realize stabilization of power supplying, the power source supplying terminal for supplying a type of the power source voltage (for example, voltage LCCOM) is provided at four positions of both ends of the X direction of the first terminal group 31 and both ends of the X direction of the second terminal group 32. In addition, one power source supplying terminal is a wide metal pattern in which a plurality of adjacent terminals are mutually short-circuited. Also, the same type of the power source supplying terminal disposed in the Y direction between the first terminal group 31 and the second terminal group 32 is short-circuited by the metal pattern.

Accordingly, various types of the power source voltages LCCOM, VDDY, and VSSY being supplied through the first flexible substrate 51 or the second flexible substrate 52 pass through two power source voltage supplying terminals corresponding to the power source voltage of both ends of the X direction of the first terminal group 31 and two power source voltage supplying terminals corresponding to the power source voltage of both ends of the X direction of the second terminal group 32 in parallel. Various power source voltages LCCOM, VDDY, and VSSY are supplied to the displaying portion or the display control circuit through four types of power source wirings on the element substrate 10 connected to the four power source voltage supplying terminals. Accordingly, stable supplying of the power source voltage can be realized.

In the element substrate 10, the signal wirings for supplying the timing signals, which control operations of the shift register 1021 inside the Y drivers 102L and 102R, such as the clocks CLY and CLYB, a shift direction instructing signal SR, and the start pulse DY, are connected to only terminals inside the first terminal group 31. When the connection destinations of the signal wirings for supplying various timing signals are divided into the first terminal group 31 and the second terminal group 32, propagation delay of both signal wirings may be different from each other, and there is a case in which the timing control of the display control circuit may become difficult.

In addition, the signal wirings for supplying the select signals SEL_1 to SEL_4 are connected to only terminals of the first terminal group 31 in the same manner as the signal wirings for supplying the timing signals. It is necessary to synchronize the select signals SEL_1 to SEL_4 being supplied to the DMPX 103_$m$ (m is 1 to 1040) with the timing signals, particularly, with the clocks CLY and CLYB.

In the embodiment, the first supplying circuit 21 mounted on the first flexible substrate 51 outputs the timing signals and the select signals SEL_1 to SEL_4 in synchronization with each other. In the embodiment, the timing signals and the select signals SEL_1 to SEL_4 pass through each terminal inside the same first terminal group 31 and are supplied to the display control circuit.

More specifically, in the element substrate 10, as an input passage of the select signals SEL_1 to SEL4 with respect to the DMPX 103_$m$ (m is 1 to 1040), an input passage from a left side and an input passage from a right side of the DMPX 103_$m$ (m is 1 to 1040) are provided (refer to FIG. 3). Meanwhile, the first supplying circuit 21 mounted on the first flexible substrate 51 outputs each of the select signals SEL_1 to SEL4 to two signal wirings, and supply the select signals to terminals inside a terminal group which is illustrated as SEL (left side) on a left side inside the first terminal group 31 and terminals inside a terminal group which is illustrated as SEL (right side) on a right side inside the first terminal group 31 through the individual signal wiring. Also, in the element substrate 10, four signal wirings which supply the select signals SEL_1 to SEL4 being supplied to the terminal group illustrated as the SEL (left side) in FIG. 7 to the DMPX 103_$m$ (m is 1 to 1040) from the left side are provided. In addition, in the element substrate 10, four signal wirings which supply the select signals SEL_1 to SEL4 being supplied to the terminal group illustrated as the SEL_(right side) to the DMPX 103_$m$ (m is 1 to 1040) from the left side are provided.

According to such a configuration, the load per one of circuits (or output buffers) outputting the select signals SEL_1 to SEL4 in the first supplying circuit 21 on the first flexible substrate 51 is reduced, and the select signals SEL_1 to SEL_4 being supplied to the DMPX 103_m (m is 1 to 1040) can be synchronized with the timing signals which are supplied to the Y drivers 102_L and 102_R by the first supplying circuit 21.

Also, eight terminals in the first terminal group 31 as illustrated in FIG. 3 to which the select signals SEL_1 to SEL_4 are supplied and eight terminals of the second terminal group 32 being formed at positions corresponding to the eight terminals described above may be connected to each other one by one using eight signal wirings, or may not be connected to each other. In a case in which the terminals are connected to each other, the signals from the second supplying circuit 22 are not supplied to the eight terminals of the second terminal group 32.

Next, terminals and signal wirings supplying the enable signals ENBY_k (k is 1 to 8) will be described. As described above, in the embodiment, an eight-phase enable signal ENBY_k (k is 1 to 8) is supplied to the display control circuit. As illustrated in FIG. 7, a signal wiring for supplying the enable signal ENBY_odd of which an index k is an odd number among the enable signals ENBY_k (k is 1 to 8) is connected to only a terminal of the second terminal group 32, and a signal wiring for supplying the enable signal ENBY_even of which the index k is an even number is connected to only a terminal of the first terminal group 31. A reason that such eight types of the enable signals are supplied to the display control circuit and the connection destination of each signal wiring for the enable signal ENBY_k (k is 1 to 8) is divided into the first terminal group 31 and the second terminal group 32 is as follows.

The enable signal as described above is a signal which is a basis of the scanning pulse. In the embodiment, the eight-phase enable signal ENBY_k (k is 1 to 8) is used, but the scanning pulse can be generated from one-phase enable signal at frequency eight times of the eight-phase enable signal. However, as seen from the above, the one-phase enable signals are respectively applied to each of 2176 NAND gates 1022 respectively corresponding to 2176 scan lines SL1 to SL2176, and the shift register 1021 controls to switch the NAND gate 1022 through which the enable signal passes. In this case, the loads of the 2176 NAND gates 1022 are connected to each signal wiring transmitting the enable signal. Such loads are excessive, and thus driving of the electrooptical apparatus 1000 at a high speed is hindered.

Here, in the embodiment, the 2176 scan lines SL1 to SL2176 are divided into eight groups, and a type of the enable signal ENBY_k is supplied to the scan lines of one group, that is, to 272 NAND gates 1022 connected to 2176/8=272 scan lines. As described above, when the eight-phase enable signal ENBY_k (k is 1 to 8) is used, the load per one signal line transmitting the enable signal is reduced as 1/8 in a case of one phase.

Here, it is considered that the eight signal wirings for the enable signals ENBY_k (k is 1 to 8) may be connected only the first terminal group 31 or the second terminal group 32. However, for example, when the eight signal wirings for the enable signals ENBY_k (k is 1 to 8) are connected to only the first terminal group 31, the first supplying circuit 21 mounted on the first flexible substrate 51 drives each NAND gate 1022 corresponding to each of the 2176 scan lines SL1 to SL2176 through the eight signal wirings, and thus power consumption of the first supplying circuit 21 is excessive.

Here, in the embodiment, the signal wiring for supplying the enable signal ENBY_even is connected to only a terminal of the first terminal group 31 so as to be driven by the first supplying circuit 21 on the first flexible substrate 51, and the signal wiring for supplying the enable signal ENBY_odd is connected to only a terminal of the second terminal group 32 so as to driven by the second supplying circuit 22 of the second flexible substrate 52. Also, as illustrated in FIG. 3, since the enable signals ENBY_1 to ENBY_8 are input from the left side of the first terminal group 31 and the second terminal group 32, first, the signals are supplied to the Y driver 102_L disposed on the left side through the signal wiring formed on the element substrate 10. Also, the signals are supplied to the Y driver 102_R disposed on the right side through the signal wiring formed above the element substrate 10.

Next, terminals and signal wirings supplying the video signal VIDm (m is 1 to 1040) will be described. There are a plurality of the signal wirings for supplying the video signal VIDm (m is 1 to 1040), and the signal wirings cannot be connected to only one of the first terminal group 31 or the second terminal group 32. Here, in the embodiment, as illustrated in FIG. 7, the connection destinations of signal wirings for supplying the video signal VIDm (m is 1 to 1040) are dispersed to the first terminal group 31 and the second terminal group 32. Specifically, the signal wirings of video signals VIDodd of which an index m is an odd number in the signal wirings of the video signals VIDm (m is 1 to 1040) arranged in the X direction inside a display circuit 100 are respectively connected to each terminal of the second terminal group 32, and signal wirings of the video signal VIDeven of which an index m is an even number are respectively connected to each terminal of the first terminal group 31.

In order to realize a high speed operation, it is necessary to provide a propagation delay time taken for the video signal VIDm (m is 1 to 1040) to reach the DMPX 103_m (m is 1 to 1040). In the embodiment, in a state in which the connection destinations of the signal wirings are dispersed to the first terminal group 31 and the second terminal group 32, in order to provide the propagation delay time of the video signal VIDm (m is 1 to 1040), a configuration of the signal wiring is made to be improved.

Figure 8:
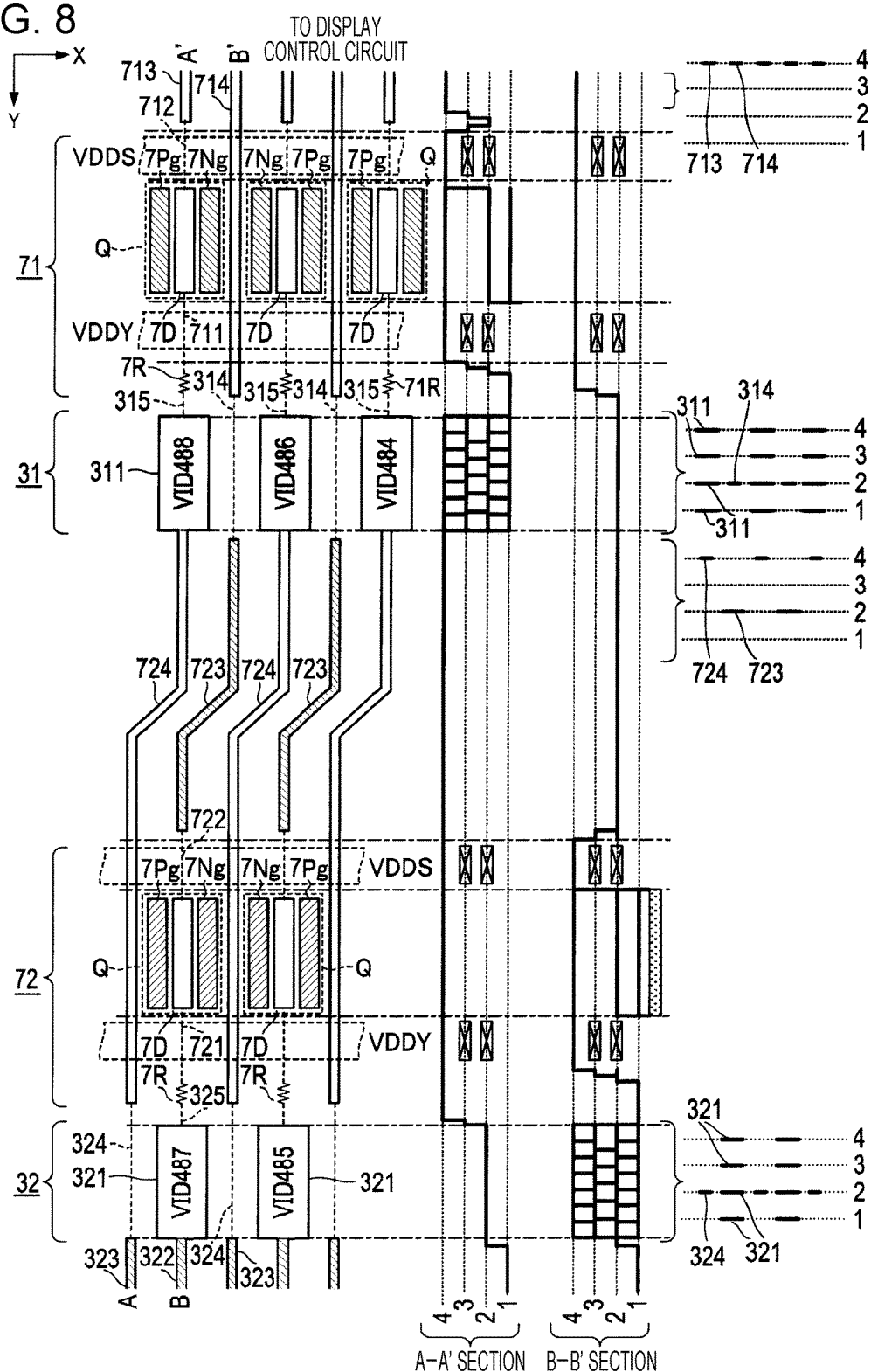
FIG. 8 is an explanatory view illustrating signal wirings passing through video signal terminals of the first terminal group and the second terminal group.

FIG. 8 is an explanatory view illustrating signal wirings passing through terminals for video signals of the first terminal group 31 and the second terminal group 32. In FIG. 8, terminals 311 for the video signals VID488, 486, and . . . which are a part of the video signal VIDm of which the index m is an even number in the first terminal group 31 is illustrated. In addition, in FIG. 8, terminals 321 for the video signals VID487, 485, and . . . which are a part of the video signal VIDm of which the index m is an odd number in the second terminal group 32 is illustrated. In the embodiment, each terminal 311 for the video signal in the first terminal group 31 and each terminal 321 for the video signal in the second terminal group 32 are positioned at the same position in the X direction.

The protection circuit region 72 is provided between the first terminal group 31 and the second terminal group 32. In addition, the protection circuit region 71 is provided between the first terminal group 31 and the displaying portion. A plurality of protection circuits Q are formed inside the protection circuit region 72 and the protection circuit region 71.

Figure 9:
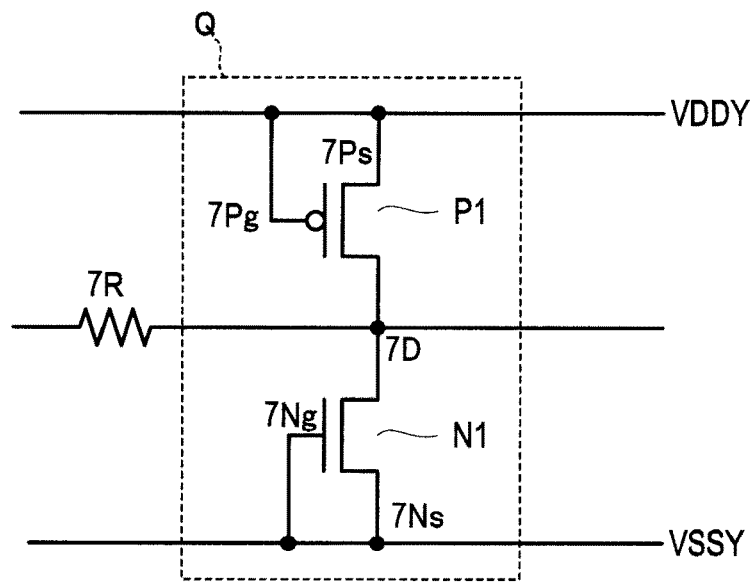
FIG. 9 is a circuit diagram illustrating configuration of a protection circuit of the embodiment.

FIG. 9 illustrates a circuit diagram of the protection circuit Q. The protection circuit Q illustrated in the drawing is provided with a protective resistance 7R, a metal oxide semiconductor field effect transistor (MOSFET, hereinafter, simply refer to as a transistor) P1 of a p-channel, and a transistor N1 of an n-channel. A gate 7Pg and a source 7Ps of the transistor P1 are short-circuited, and the high potential power source voltage VDDY is supplied thereto. Meanwhile, a gate 7Ng and a source 7Ns of the transistor N1 are short-circuited, and the low potential power source voltage VSSY is supplied thereto.

The protective resistance 7R is connected to a drain 7D common to the transistor P1 and the transistor N1. Due to the protection circuit Q, a voltage of the common drain 7D, that is, a voltage of the signal wiring for the video signal is limited to range from a lower voltage as a threshold voltage of the transistor N1 than the low potential power source voltage VSSY to a higher voltage as a threshold voltage of the transistor P1 than the high potential power source voltage VDDY. Accordingly, even when a high voltage is applied to the first terminal group 31 or the second terminal group 32 due to static electricity or the like, it is possible to suppress being electrostatic breakdown of the display control circuit. Also, the plurality of protection circuits Q are formed on the protection circuit region 71 in the same manner.

As illustrated in FIG. 8, a pair of the transistor P1 and the transistor N1 is formed on one terminal 321 in the protection circuit region 72. Also, the drain 7D common to two transistors in an off state is positioned at the same position in the X direction as that of the terminal 321. In this point, the above description is also applied to the protection circuit region 71 in the same manner.

A configuration of signal passages for the video signals VID487, VID485, and . . . passing through the terminal 321 belonging to the second terminal group 32 is as follows. For example, the signal passage for the video signal VID487 includes the signal wiring 325, the signal wiring 721, and the signal wiring 722. The signal wiring 325 is connected to the terminal 321 for the video signal VID487 and one end of the protective resistance 7R. The signal wiring 721 is connected to another end of the protective resistance 7R and the drain 7D of the transistors P1 and N1. The signal wiring 722 extends the display circuit 100 side from the drain 7D along the Y direction.

Here, the terminal 321 for the video signal VID487, the signal wiring 325, the protective resistance 7R, the drain 7D of the transistor, and the signal wiring 722 are positioned in a straight line along the Y direction.

In addition, the signal passage for the video signal VID487 includes the signal wiring 723. In the signal wiring 723, there is a first section extending in the first direction (Y direction) from a connecting part with the signal wiring 722 to the display circuit 100 side. In addition, in the signal wiring 723, there is a second section which is connected to the first section and extends in the second direction curved to the first direction. In addition, in the signal wiring 723, there is a third section which is connected to the second section and extends in the first direction (Y direction) toward the center between two terminals 311 for the video signals VID488 and VID486 of the first terminal group 31. In addition, the signal passage for the video signal VID487 includes the signal wiring 314 which extends in the first direction (Y direction) from the connecting part with the signal wiring 723 to the display control circuit through the center between the two terminals 311.

Further, the signal passage for the video signal VID487 includes the signal wiring 322 which extends from the terminal 321 for the video signal VID487 to an end portion of the element substrate 10 on an opposite side of the display control circuit.

In the signal passage for the video signal VID487 as described above, the signal wirings 322 and 723 are a metal layer wiring on the same layer as the terminal 321, and the signal wirings 325, 721, 722, and 314 are a metal layer wiring on a lower layer than the terminal 321. In addition, the terminal 311 is a metal layer wiring on the same layer as the terminal 321. Accordingly, the terminal 311 of the first terminal group 31 and the signal wiring 314 which transmits the video signal from the second terminal group 32 are a metal layer wiring on the different layer.

Signal passages for other video signals VID485 and VID483 other than the video signal VID487 passing through the second terminal group 32 are also configured in the same manner.

A configuration of signal passages for the video signals VID488, VID486, and . . . which pass through the terminals 311 belonging to the first terminal group 31 is as follows. For example, the signal passage for the video signal VID486 includes the signal wiring 315 connecting the terminal 311 to the video signal VID486 and one end of the protective resistance 71R to each other. Another end of the protective resistance 71R is connected to the signal wiring (not illustrated) which passes through the drain 7D of the transistor in an OFF state and extends to the display circuit 100 side in the same manner as the signal passage for the video signal VID487.

In addition, the signal passage for the video signal VID486 includes the signal wiring 724. In the signal wiring 724, there is a first section extending to an end portion of the element substrate 10 along the first direction (Y direction) from the terminal 311 for the video signal VID486. In addition, in the signal wiring 724, there is a second section which is connected to the first section and extends in the second direction curved with respect to the first direction. In addition, in the signal wiring 724, there is a third section which is connected to the second section and passes through an upper layer of a source 72S of the transistor in the first direction (Y direction) so as to extend toward the center between two terminals 311 for the video signals VID487 and VID485 in the first direction (Y direction).

Further, the signal passage for the video signal VID486 includes the signal wirings 324 and 323 which extend to the end portion of the element substrate 10 through the center between the two terminals 311 of the video signals VID487 and VID485 from a connecting part with the signal wiring 724. Also, in a manufacturing process of the electrooptical panel 1, the signal wirings 322 and 323 are connected to a guard ring, but the guard ring is not connected to a completed body. The signal wiring 322 and 323 may be provided with end portions thereof at a predetermined position, or may be connected to a test terminal.

Next, an A-A' section of the signal passage for the video signal VID486 will be described. The element substrate 10 includes a structure of four layers. A first layer is a polysilicon layer, and the second layer to the fourth layer are a metal wiring layer. As a material of the second layer to the fourth layer, aluminum, an aluminum alloy (for example, ALTi), or the like can be used.

The signal wiring 323 is constituted of the first layer (polysilicon layer). In addition, the signal wiring 324 is constituted of the second layer. The signal wiring 724 is constituted of the fourth layer. Also, power source wirings for supplying the high potential power source voltage VDDY and the low potential power source voltage are constituted of the second layer and the third layer.

Next, the terminal 311 connects the first layer, the second layer, the third layer, and the fourth layer through a through hole. As described above, all four layers are used because stiffness necessary for pressing the first flexible substrate 51 is secured and a resistance of the terminal 311 is reduced. Also, an upper surface of the terminal 311 is preferably formed of an indium tin oxide film (ITO). In addition, it is not necessary for the substrate to be constituted of four layers, and the substrate is preferably configured with at least two or more layers.

In the protection circuit region 71, the resistance 7R is generated due to the first layer (polysilicon layer). The signal wiring 711 connecting the resistance 7R and the protection circuit Q is constituted of the fourth layer. Also, the protection circuit Q is constituted using the first layer, the third layer, and the fourth layer.

In addition, the signal wiring 712 is constituted of the fourth layer, and the signal wiring 713 is constituted of the fourth layer.

Next, a B-B' section of the signal passage for the video signal VID486 will be described. The signal wiring 322 is constituted of the first layer (polysilicon layer). The terminal 321 connects the first layer, the second layer, the third layer, and the fourth layer through the through hole. Also, an upper surface of the terminal 321 is preferably formed of an ITO film.

In the protection circuit region 72, the resistance 7R is constituted of the first layer (polysilicon layer). Also, the protection circuit Q is constituted using the first layer, the third layer, and the fourth layer.

In addition, the signal wiring 722 is constituted using the fourth layer, and the signal wiring 723 and the signal wiring 314 are constituted using the second layer. Further, a wiring 714 is constituted using the fourth layer.

The second layer is used between the protection circuit region 72 to the first terminal group 31. Also, the fourth layer is used for the signal wiring 714 reaching the display control circuit the same as the signal wiring 713. Further, the signal wiring 724 using the fourth layer is formed and the signal wiring 723 using the second layer different from the fourth layer is formed between the first terminal group 31 and the second terminal group 32. Here, the signal wiring 724 and the signal wiring 723 do not overlap with each other when seen from the front in a vertical direction with respect to the element substrate 10.

Here, a thickness of the signal wiring 724, for example, is preferably 0.2 µm to 0.4 µm, and a width thereof is preferably 5 µm to 10 µm. Meanwhile, a thickness of the signal wiring 723 is preferably 0.25 µm to 0.45 µm, and a width thereof is preferably 15 µm to 30 µm. Further, a distance between the second layer and the fourth layer is preferably 1 µm to 1.5 m.

A configuration of signal passages for the other video signals VID486, VID485, and . . . other than the video signals VID488 and VID487 passing through the first terminal group 31 is the same as described above.

In the signal passage for the video signal which passes through the first terminal group 31, the signal wiring extending from the terminal 311 to an end portion of the element substrate 1 is provided, such that a capacitance being connected to the signal passage and a capacitance being connected to the signal passage for the video signal which passes through the second terminal group 32 are substantially equal to each other.

In the embodiment, the second terminal group 32 is further distant away from the display control circuit than the first terminal group 31. Therefore, when a width of the wiring of the signal wiring for supplying the video signal is equal to those of the second terminal group 32 and the first terminal group 31, a resistance of the signal wiring which passes through the second terminal group 32 becomes more increased than a resistance of the signal wiring which passes through the first terminal group 31. Here, in the embodiment, when the width or the like of the signal wiring is adjusted, the resistance of the signal wiring of the video signal VID_even from the first terminal group 31 reaching the DMPX 103_m and the resistance of the signal wiring of the video signal VID_odd from the second terminal group 32 reaching the DMPX 103_m are substantially equal to each other.

In addition, in the embodiment, since the signal wiring for the video signal which passes through the second terminal group 32 passes through between the adjacent two terminals 311 of the first terminal group 31, a length of the wiring of the signal wiring for the video signal which passes through the second terminal group 32 can be made as short as possible.

Accordingly, according to the embodiment, the resistances both of the signal wiring which passes through the first terminal group 31 and the signal wiring which passes through the second terminal group 32 can be reduced.

Therefore, according to the embodiment, the propagation delay time of the video signal VIDm (m is 1 to 1040) is made as short as possible and provided, and thus making it possible to realize a high speed operation of the electrooptical apparatus 1000.

In addition, in the embodiment, the wiring 314 passing through between the terminals 311 adjacent to the first terminal group 31 is set as a wiring on a different layer from that of the terminal 311, the wiring 324 passing through between the terminals 321 and adjacent to the second terminal group 32 is set as a wiring on a different layer from that of the terminal 321. Therefore, in the embodiment, a cross coupling between the adjacent two signal wirings for the video signals can be reduced.

In addition, according to the embodiment, in order for the signal wiring for the video signal which passes through the second terminal group 32 to face between the adjacent two terminals 311 of the first terminal group 31, the signal wiring 723 including an inclined section is provided in a region between the drain 7D of the transistor and the first terminal group 31. According to this aspect, since electrostatic noise input to the terminal 321 is applied to the signal wiring 723 in a state of being sufficiently weakened by passing through the protective resistance 7R and the drain 7D of the transistor, it is possible to prevent discharging from an edge from being generated at a boundary between a Y direction section and an inclined section of the signal wiring 723, and to prevent the signal wiring 723 from being melted or the like.

B. Modification Example

Hitherto, the embodiment of the invention is described, but of course the embodiment may be modified as follows.

B-1

In the embodiment as described above, the connection destinations of a half of eight signal wirings for supplying the enable signals are set as the first terminal group 31, and the connection destinations of the other half thereof are set as the second terminal group 32; however, it is only an example, the number of the signal wirings for the enable signals connecting to the first terminal group 31 and the number of the signal wirings for the enable signals connecting to the second terminal group 32 may be changed. That is, the number of the signal wirings for the enable signals connecting to the first terminal group 31 and the number of the signal wirings for the enable signals connecting to the second terminal group 32 are adjusted, such that both power consumption of the first supplying circuit 21 on the first flexible substrate 51 and power consumption of the second supplying circuit 22 on the second flexible substrate 52 becomes an appropriate value.

B-2

In the embodiment described above, as a switching element of the pixel circuit, a case in which three terminal elements represented by TFT are used is described, but the embodiment may be configured with two terminal elements such as a diode. However, in a case in which two terminal elements are used as the switching element of the pixel circuit, the scan line is formed on one part of a substrate, the data line is formed on another part thereof, and the two terminal elements are necessarily formed between either of the scan line or the data line and the pixel electrode. In this case, the pixel circuit is configured with two terminal elements which are connected in series between the scan line and the data line, and a liquid crystal.

B-3

In the embodiment described above, as an example of the electrooptical apparatus, a liquid crystal displaying apparatus of an active matrix type is described, but it is not limited thereto, and the embodiment can be also applied to a passive type using a super twisted nematic (STN) liquid crystal or the like. In addition, the embodiment described above may be applied to an electrooptical apparatus including an organic light emitting diode element using an organic electro luminescent (EL), which is used as the electro-optical material, as a light emitting element. In addition, the invention may be applied to an electrooptical panel using the electro-optical material other than the organic EL. The electro-optical material is a substance of which optical characteristics such as transmittance and luminance are changed by supplying an electric signal (current signal or voltage signal). For example, the invention can be applied to a display panel using a liquid crystal, a light emitting polymer, or the like as the electro-optical material, or an electrophoretic display panel using a microcapsule including colored liquid and white particles dispersed in the liquid as the electro-optical material in the same manner as the embodiment described above. Also, the invention can be applied to a twist ball display panel using twist balls which are painted in different colors in each region having different polarity as the electro-optical material in the same manner as the embodiment described above. In addition, the invention can be applied to a toner display panel using a black toner as the electro-optical material in the same manner as the embodiment described above. Further, the invention can be applied to various electrooptical panel such as a plasma display panel using a high pressure gas such as helium or neon as the electro-optical material in the same manner as the embodiment described above.

C. Application Example

Figure 10:
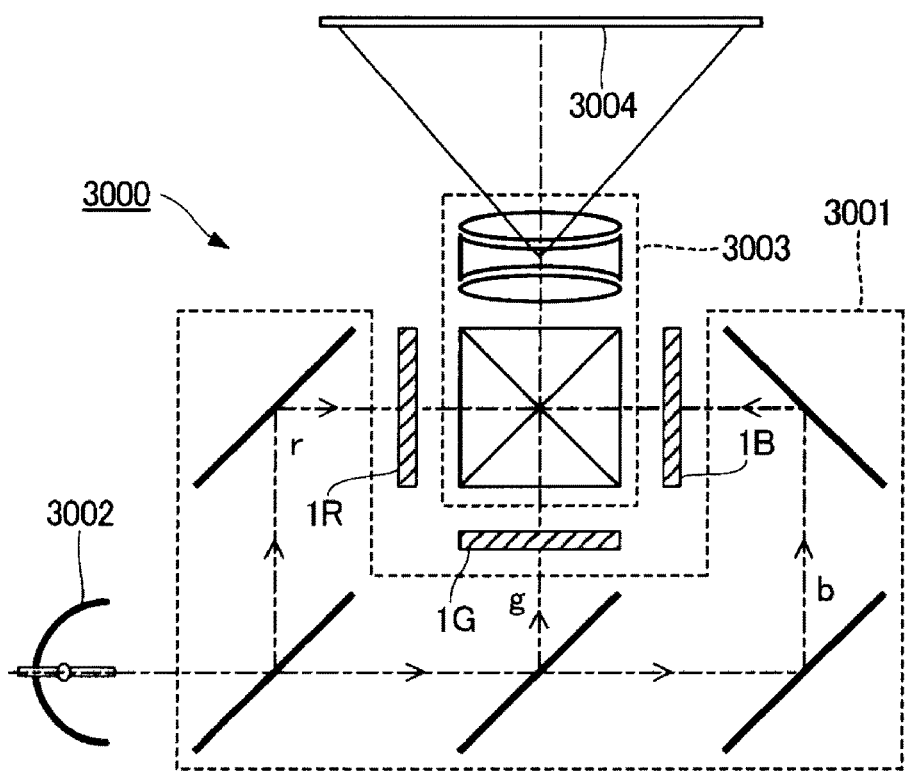
FIG. 10 is a perspective view illustrating a configuration of a projection type displaying apparatus which is an application example of the embodiment.

FIG. 10 is a schematic diagram of a projection type displaying apparatus (three-plate type projector) 3000 to which the electrooptical apparatus 1000 is applied. The projection type displaying apparatus 3000 is configured with three electrooptical apparatuses 1 (1R, 1G, and 1B) corresponding to different display colors (red, green, and blue) from one another. An illumination optical system 3001 supplies a red component r in an emitting light beam from a light emitting device (light source) 3002 to the electrooptical apparatus 1R, supplies a green component g to the electrooptical apparatus 1G, and supplies a blue component b to the electrooptical apparatus 1B. Each electrooptical apparatus 1000 functions as a modulator (light valve) which modulates each monochromatic light supplied from the illumination optical system 3001 in accordance with a display image. A projection optical system 3003 synthesizes the emitting light from each the electrooptical apparatus 1000 and projects the synthesized light to a projection surface 3004. When the electrooptical apparatus 1000 described above is applied, the small projection type displaying apparatus 3000 capable of displaying high definition can be easily realized.

Figure 11:
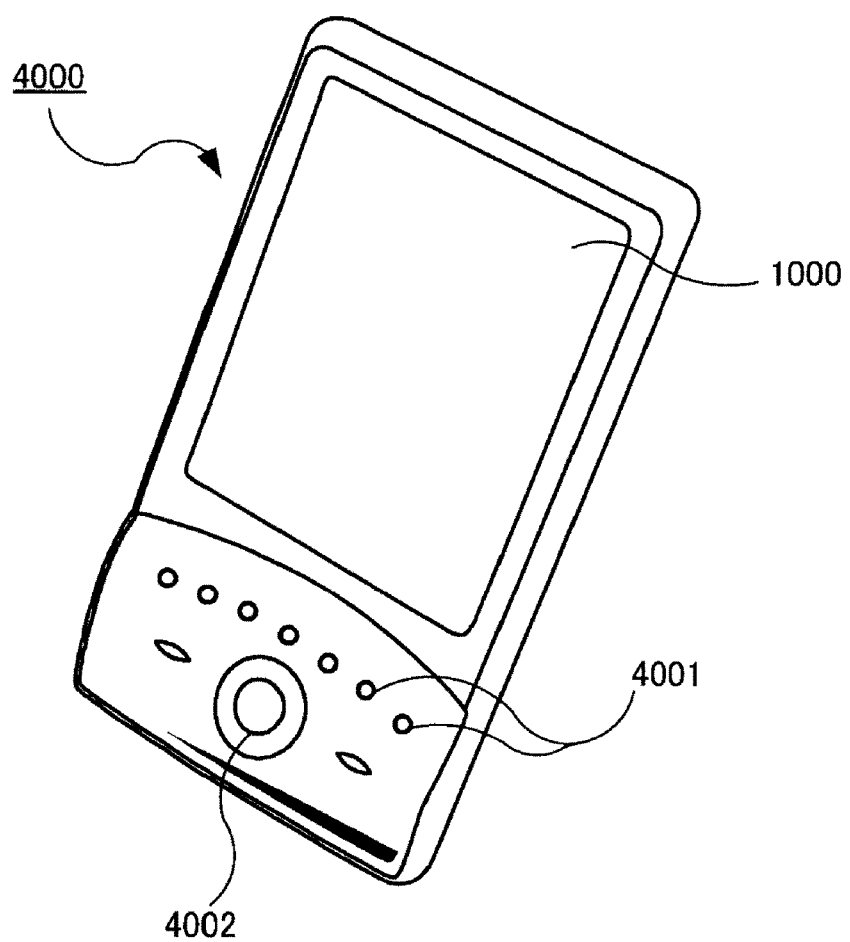
FIG. 11 is a perspective view illustrating a configuration of an information portable terminal which is an application example of the embodiment.

FIG. 11 is a view illustrating a configuration example of an information portable terminal (personal digital assistants (PDA)) to which the electrooptical apparatus 1000 is applied. An information portable terminal 4000 is provided with a plurality of operating buttons 4001 and a power source switch 4002, and the electrooptical apparatus 1000 as a displaying unit. When the power source switch 4002 is operated, various information items such as address books or schedule books are displayed on the electrooptical apparatus 1000.

Also, as the electronic device to which the electrooptical apparatus 1000 is applied, in addition to the devices illustrated in FIGS. 9 to 11, there are digital still cameras, liquid crystal televisions, viewfinder type or monitor direct viewing type video tape recorders, car navigation devices, pagers, electronic notebooks, calculators, devices having a touch panel, and the like. Also, as the displaying portion of the various electronic devices, the electrooptical apparatus can be applied.

This application claims priority to Japan Patent Application No. 2017-019438 filed Feb. 6, 2017, the entire disclosures of which are hereby incorporated by reference in their entireties.

What is claimed is:

1. An electrooptical apparatus comprising:
a substrate including a displaying portion displaying an image, a display control circuit for driving the displaying portion, a first terminal group, and a second terminal group;
a first flexible substrate connected to the first terminal group;
a second flexible substrate connected to the second terminal group, the first flexible substrate and the second flexible substrate being sequentially disposed from the displaying portion on the substrate;
a first signal wiring that supplies video signal and that is electrically connected between the first terminal group and the display control circuit; and
a second signal wiring that supplies video signal and that is electrically connected between the second terminal group and the display control circuit, wherein,
a resistance of the first signal wiring and a resistance of the second signal wiring are equal to each other, and
a capacitance of the first signal wiring and a capacitance of the second signal wiring are equal to each other.

2. An electrooptical apparatus comprising:
a substrate including a displaying portion displaying an image, a display control circuit for driving the displaying portion, a first terminal group, and a second terminal group;
a first flexible substrate connected to the first terminal group;
a second flexible substrate connected to the second terminal group, the first flexible substrate and the second flexible substrate being sequentially disposed from the displaying portion on the substrate;
a first signal wiring that supplies video signal and that is electrically connected between the first terminal group and the display control circuit; and
a second signal wiring that supplies video signal and that is electrically connected between the second terminal group and the display control circuit, wherein
a resistance of the first signal wiring and a resistance of the second signal wiring are equal to each other, and
the second signal wiring is disposed between two terminals adjacent to each other in the first terminal group.

3. The electrooptical apparatus according to claim 2, wherein the two terminals and the second signal wiring are disposed on different layers from each other.

4. An electrooptical apparatus comprising:
a substrate including a displaying portion displaying an image, a display control circuit for driving the displaying portion, a first terminal group, and a second terminal group;
a first flexible substrate connected to the first terminal group;
a second flexible substrate connected to the second terminal group, the first flexible substrate and the second flexible substrate being sequentially disposed from the displaying portion on the substrate;
a first signal wiring that supplies video signal and that is electrically connected between the first terminal group and the display control circuit;
a second signal siring that supplies video signal and that is electrically connected between the second terminal group and the display control circuit; and
a protection circuit disposed between the first terminal group and the second terminal group, wherein
a resistance of the first signal wiring and a resistance of the second signal wiring are equal to each other, and
the second signal wiring includes a signal wiring reaching the protection circuit from the first terminal group, and a signal wiring which extends along a first direction from the protection circuit toward the display control circuit side, continues in a second direction curved to the first direction, and then passes through between two terminals adjacent to each other of the second terminal group extending in the first direction.

* * * * *